(12) United States Patent
Edwards et al.

(10) Patent No.: US 12,154,841 B2
(45) Date of Patent: Nov. 26, 2024

(54) NANOSCALE THERMOELECTRIC REFRIGERATOR

(75) Inventors: Henry Litzmann Edwards, Garland, TX (US); Tathagata Chatterjee, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 359 days.

(21) Appl. No.: 12/201,679

(22) Filed: Aug. 29, 2008

(65) Prior Publication Data

US 2009/0056345 A1 Mar. 5, 2009

Related U.S. Application Data

(60) Provisional application No. 60/968,805, filed on Aug. 29, 2007.

(51) Int. Cl.
*H10N 10/01* (2023.01)
*H01L 23/38* (2006.01)
*H10N 19/00* (2023.01)
*F25B 21/02* (2006.01)

(52) U.S. Cl.
CPC ............ *H01L 23/38* (2013.01); *H10N 10/01* (2023.02); *H10N 19/00* (2023.02); *F25B 21/02* (2013.01); *H01L 2924/0002* (2013.01); *Y10T 29/49117* (2015.01)

(58) Field of Classification Search
USPC .................................................. 136/200–242
See application file for complete search history.

(56) References Cited

U.S. PATENT DOCUMENTS

| | | | | |
|---|---|---|---|---|
| 6,207,887 | B1 * | 3/2001 | Bass et al. | 136/201 |
| 6,476,508 | B1 * | 11/2002 | Strnad | 257/467 |
| 6,774,450 | B2 * | 8/2004 | Inbe | 257/467 |
| 2007/0095381 | A1 * | 5/2007 | Lee | H01L 35/32 |
| | | | | 136/230 |
| 2008/0173537 | A1 * | 7/2008 | DeSteese et al. | 204/192.25 |
| 2009/0014807 | A1 * | 1/2009 | Tang et al. | 257/369 |

OTHER PUBLICATIONS

"Enhanced Thermoelectric Performance of Rough Silicon Nanowires," Nature Publishing Group, vol. 451, Jan. 10, 2008, doi:10.1038/nature06381, pp. 163-168 (Hochbaum, et al.).

(Continued)

*Primary Examiner* — Dustin Q Dam
(74) *Attorney, Agent, or Firm* — Andrew R. Ralston; Frank D. Cimino

(57) ABSTRACT

A nanoscale thermoelectric device, which may be operated as a refrigerator or as a thermoelectric generator includes N-type and p-type active areas connected to a central terminal and end electrodes made of interconnect metal. Reducing lateral dimensions of the active areas reduces vertical thermal conduction, thus improving the efficiency of the thermoelectric device. The thermoelectric device may be integrated into the fabrication process sequence of an IC without adding process cost or complexity. Operated as a refrigerator, the central terminal may be configured to cool a selected component in the IC, such as a transistor. Operated as a thermoelectric generator with a heat source applied to the central terminal, the end terminals may provide power to a circuit in the IC.

8 Claims, 7 Drawing Sheets

(56) References Cited

OTHER PUBLICATIONS

"Silicon Nanowires as Efficient Thermoelectric Materials," Nature Publishing Group, vol. 451, Jan. 10, 2008, doi:10.1038/nature06458, pp. 168-171 (Baukai, et al.).

"Silicon Nanowires as Efficient Thermoelectric Materials—Supplementaray Information (Experiment)," Nature Publishing Group, doi: 10.1038/nature06458, pp. 1-21 (Boukai, et al.).

"Analytical Modeling of Silicon Thermoelectric Microcooler," Journal of Applied Physics 100, 2006, pp. 014501-1 through 01450-13 (Wang, et al.).

"On-Chip Hot Spot Cooling Using Silicon Thermoelectric Microcoolers," Journal of Applied Physics (AIP), vol. 102, Issue 3, Device Physics, Aug. 2, 2007, pp. 1-3 (Wang, et al.) http://jap.aip.org/resource/1/japiaulvl 02/i3/p034503-'-sl ?isAuthorized=no.

"Performance Metrics for Themoelectric Energy Harvesting Studied Using a Novel Planar 65nm Silicon CMOS-Based Thermopile," IEEE Sensors 2013 Conference, Baltimore, MD, Nov. 3-6, 2013, pp. 1-4 (H. Edwards, et al.).

"Shallow trench isolation; https://en.wikipedia.org/w/index.php?title=Shallow_trench_isolation&oldid=1040502151 (last visited Mar. 3, 2022)".

* cited by examiner

NANOSCALE THERMOELECTRIC REFRIGERATOR

FIELD OF THE INVENTION

This invention relates to the field of integrated circuits. More particularly, this invention relates to thermoelectric devices in integrated circuits.

BACKGROUND OF THE INVENTION

It is well known that integrated circuits (ICs) frequently generate heat during operation so as to raise temperatures of internal components such as transistors above 90 C. Some component performance parameters such as noise and off-state current degrade significantly when the component temperatures rise above ambient. It is generally desired to cool some components in ICs, but cooling mechanisms and methods which use ambient air, such as fans mounted on IC packages, provide limited cooling of key components. Thermoelectric coolers mounted on IC packages consume too much power to be useful in many applications, and often fail to provide sufficient cooling of key components.

It is also well known that many ICs operate on portable power supplies such as batteries. It is desirable to increase operational times between renewing or recharging the portable power supplies.

SUMMARY OF THE INVENTION

This Summary is provided to comply with 37 C.F.R. § 1.73, requiring a summary of the invention briefly indicating the nature and substance of the invention. It is submitted with the understanding that it will not be used to interpret or limit the scope or meaning of the claims.

The instant invention provides a nanoscale thermoelectric device fabricated in an integrated circuit (IC) in which n-type and p-type active areas connected to a central terminal and end electrodes made of interconnect metal. In one embodiment, the active areas are less than 300 nanometers wide, to desirably reduce thermal conduction of heat from the end electrodes and the central terminal to the IC substrate. The nanoscale thermoelectric device may be integrated into the fabrication process sequence of the IC without adding process cost or complexity.

The nanoscale thermoelectric device may be configured to operate as a refrigerator, in which an electric current is supplied to the device, resulting in cooling of a central terminal, which may be configured to cool a selected component in the IC, such as a transistor. The nanoscale thermoelectric device may also be configured to operate as a thermoelectric generator, in which heat is supplied to the central terminal or to the IC substrate, causing a voltage to be generated between end electrodes which can provide current to an electrical load, such as a circuit in an IC.

DETAILED DESCRIPTION

Figure 1:
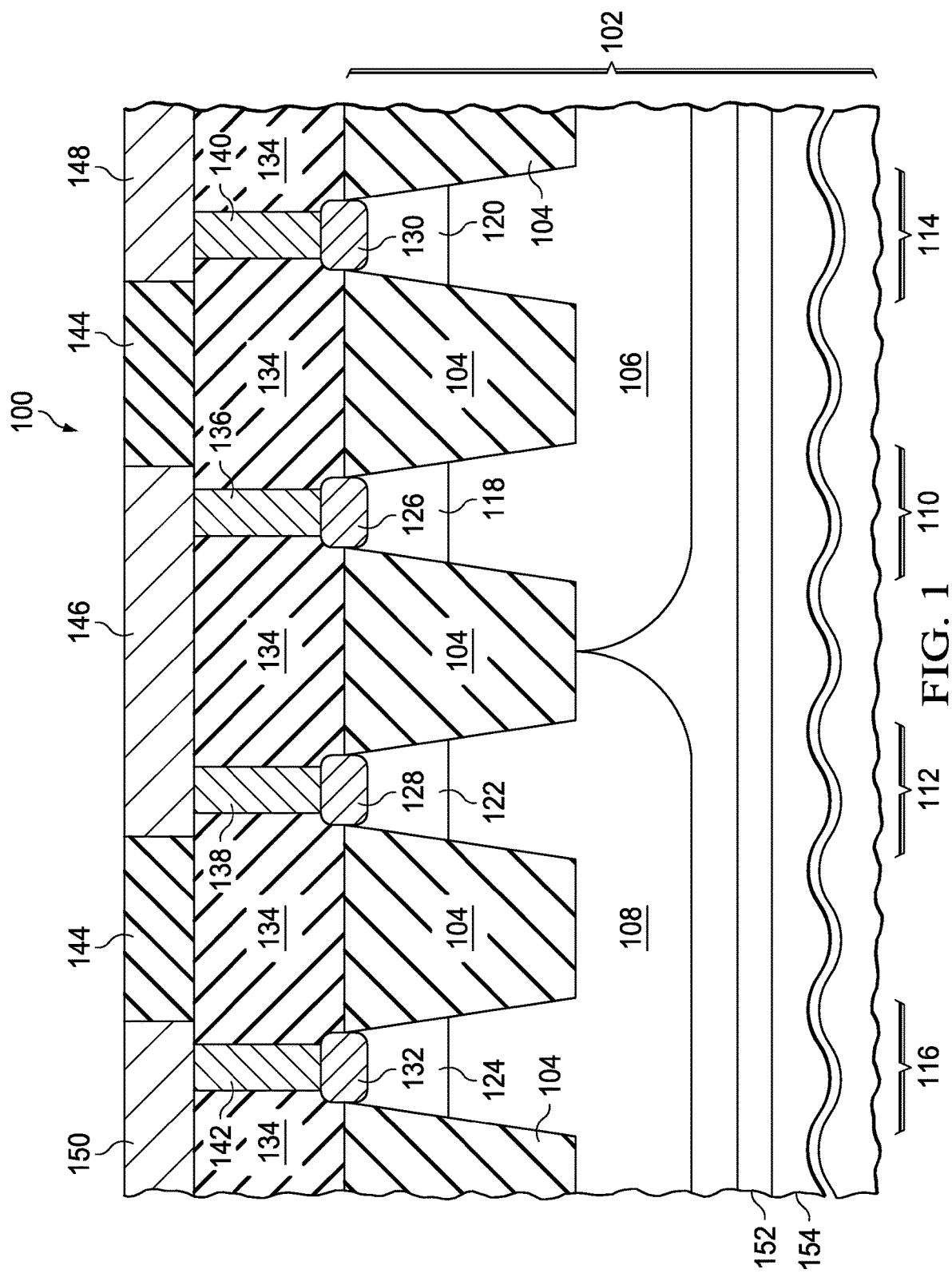
FIG. 1 is a cross-section of an IC which includes a nanoscale thermoelectric device formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The desire for a device to provide local cooling of selected components in an integrated circuit (IC) is addressed by the instant invention, which in one configuration provides a nanoscale thermoelectric refrigerator in which a central terminal is connected through n-type and p-type elements to end electrodes. Current is supplied through the n-type and p-type elements, resulting in cooling of the central terminal. The n-type and p-type elements are less than 300 nanometers wide, so as to desirably reduce thermal conduction between the end electrodes and central terminal and a substrate of the IC. The central terminal may be configured to cool a selected component in the IC, such as a transistor.

Similarly, the desire for a device to provide electrical power to circuits in an IC is also addressed by the instant invention, which in another configuration provides a nanoscale thermoelectric generator in which heat is supplied to the central terminal or to the IC substrate, which generates a voltage across the end electrodes. An electrical load, such as a circuit in an IC, may be connected to the end terminals and receive electrical power from the nanoscale thermoelectric generator.

FIG. 1 is a cross-section of an IC which includes a nanoscale thermoelectric device formed according to an embodiment of the instant invention. The IC (100) is formed in a substrate (102), typically single crystal silicon, but possibly with regions of silicon-germanium (Si—Ge) in a top region of the substrate (102). The substrate (102) may also be a wafer with an epitaxial layer, a silicon-on-insulator (SOI) wafer, a hybrid orientation technology (HOT) wafer containing regions of different crystal orientations, or any other structure capable of supporting fabrication of the IC (100). Elements of a thermally insulating layer (104) such as field oxide are formed in the substrate (102) at a top surface of the substrate (102). Field oxide may be formed by a shallow trench isolation (STI) process sequence, in which trenches, commonly 200 to 500 nanometers deep, are etched into the substrate (102), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). Other elements of the thermally insulating layer (104) formed by other methods such as deep trench isolation are within the scope of the instant invention. A p-type well (106), commonly called a p-well, is formed in the substrate (102), typically by ion implanting a p-well set of p-type dopants, including boron and possibly gallium and/or indium, at doses from $1 \cdot 10^{11}$ to $1 \cdot 10^{14}$ atoms/cm$^2$, into an area defined for the p-well (106). A p-well photoresist pattern, not shown in FIG. 1 for clarity, is commonly used to block the p-well set of p-type dopants from areas outside the p-well area. The p-well (106) extends from the top surface of the substrate (102) to a depth typically 50 to 500 nanometers below a bottom surface of the thermally insulating layer elements (104). The ion implantation process to form the p-well (106) may include additional steps to implant additional p-type dopants at shallower depths for purposes of improving n-channel metal oxide semiconductor (NMOS) transistor performance, such as threshold adjustment, leakage current reduction and suppression of parasitic bipolar operation. An n-type well (108), commonly called an n-well, is formed in the substrate (102), typically by ion implanting an n-well set of n-type dopants, including phosphorus and arsenic, and possibly antimony, at doses from $1 \cdot 10^{11}$ to $1 \cdot 10^{14}$ atoms/cm$^2$, into a region defined for the n-well (108). An n-well photoresist pattern, not shown in FIG. 1 for clarity, is commonly used to block the n-well set of n-type dopants from areas outside the n-well area. The n-well (108) extends from the top surface of the substrate (102) to a depth typically 50 to 500 nanometers below the bottom surface of the thermally insulating layer elements (104). The ion implantation process to form the n-well (108) may include additional steps to implant additional n-type dopants at shallower depths for purposes of improving p-channel metal oxide semiconductor (PMOS) transistor performance, such as threshold adjustment, leakage current reduction and suppression of parasitic bipolar operation. A sheet resistivity of the n-well (108) is commonly between 100 and 1000 ohms/square. Openings in the thermally insulating layer (104) define a first p-type active area (110), a first n-type active area (112), a second p-type active area (114), and a second n-type active area (116). The active areas (110, 112, 114, 116) are preferably less than 300 nanometers wide to reduce vertical thermal conduction between top regions of the active areas and the p-well (106) and n-well (108).

Still referring to FIG. 1, an optional first p-type diffused region (118) is formed in the first p-type active area (110). Similarly, an optional second p-type diffused region (120) is formed in the second p-type active area (114). The optional first p-type diffused region (118) and optional second p-type diffused region (120) may be formed by ion implanting a p-type tap set of p-type dopants, preferably boron, a portion of which may be in the form BF$_2$, and possibly gallium and/or indium, at a total dose between $3 \cdot 10^{13}$ and $1 \cdot 10^{16}$ atoms/cm$^2$, into areas defined for the first p-type diffused region (118) and second p-type diffused region (120). The first p-type diffused region (118) and second p-type diffused region (120), if formed, preferably extend from the top surface of the substrate (102) to a depth between 50 and 200 nanometers. In a preferred embodiment, the first p-type diffused region (118) and second p-type diffused region (120) are formed concurrently with p-type source/drain (PSD) regions in PMOS transistors, not shown in FIG. 1 for clarity, in the IC (100). An optional first n-type diffused region (122) is formed in the first n-type active area (112). Similarly, an optional second n-type diffused region (124) is formed in the second n-type active area (116). The first n-type diffused region (122) and second n-type diffused region (124) are formed by ion implanting an n-type tap set of n-type dopants, preferably phosphorus, and possibly arsenic and/or antimony, at a total dose between $3 \cdot 10^{13}$ and $1 \cdot 10^{16}$ atoms/cm$^2$, into areas defined for the first n-type diffused region (122) and second n-type diffused region (124). The first n-type diffused region (122) and second n-type diffused region (124) preferably extend from the top surface of the substrate (102) to a depth between 50 and 200 nanometers. In a preferred embodiment, the first n-type diffused region (122) and second n-type diffused region (124) are formed concurrently with n-type source/drain (NSD) regions in NMOS transistors, not shown in FIG. 1 for clarity, in the IC (100).

Continuing to refer to FIG. 1, an optional first p-type active area metal silicide layer (126), an optional first n-type active area metal silicide layer (128), an optional second p-type active area metal silicide layer (130) and an optional second n-type active area metal silicide layer (132) are formed on the optional p-type diffused regions (118, 120) and optional n-type diffused regions (122, 124), if formed, or the underlying p-type active areas (110, 114) and n-type active areas (112, 116). Metal silicide layers may be formed, for example, by depositing a layer of metal such as nickel on an existing top surface of the IC (100), heating the IC (100) to react a portion of the metal layer with exposed silicon, followed by selectively removing unreacted metal from the IC (100) using wet etchants. In a preferred embodiment, the optional metal silicide layers (126, 128, 130, 132), if formed, are formed concurrently with metal silicide layers on NSD and PSD regions in NMOS and PMOS transistors, not shown in FIG. 1 for clarity, in the IC (100). A pre-metal dielectric (PMD) layer (134), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the IC (100). A first p-type active area contact (136), a first n-type active area contact (138), a second p-type active area contact (140) and second n-type active area contact (142) are formed in the PMD layer (134) to make electrical connections to the first p-type active area (110), first n-type active area (112), second p-type active area (114), and second n-type active area (116), respectively, through the optional metal silicide layers (126, 128, 130, 132) and optional diffused regions (118, 120, 122, 124), if present. The contacts (136, 138, 140, 142) are formed in the PMD layer (134), for example, by defining contact areas on a top surface of the PMD layer (134) by a contact photoresist pattern, not shown in FIG. 1 for clarity, etching contact holes through the PMD layer (134) using reactive ion etching methods to expose underlying layers, and lining the contact holes with a contact liner metal such as titanium followed by filling the contact holes with a contact metal such as tungsten. In a preferred embodiment, the contacts (136, 138, 140, 142) are formed concurrently with contacts to NMOS and PMOS transistors, not shown in FIG. 1 for clarity, in the IC (100). An intra-metal dielectric (IMD) layer (144), typically organo-silicate glass (OSG), carbon-doped silicon oxides (SiCO or CDO) or methylsilsesquioxane (MSQ), and typically between 50 and 150 nanometers thick, is formed on the top surface of the PMD layer (134) using known deposition methods. A central metal terminal (146) is formed in the IMD layer (144) to electrically connect the first p-type active area contact (136) and the first n-type active area contact (140). A first electrode (148) is formed in the IMD layer (144) to electrically connect the second p-type active area contact (140) to an external circuit, not shown in FIG. 1 for clarity. Similarly, a second electrode (150) is formed in the IMD layer (144) to electrically connect the second n-type active area contact (142) to the external circuit. The central metal terminal (146), first electrode (148) and second electrode (150) are formed in the IMD layer (144), for example by etching trenches in the IMD layer (144) using known etching methods to expose top surfaces of the contacts (136, 138, 140, 142), lining the trenches with an interconnect liner metal such as tantalum nitride, filling the trenches with copper using known electroplating methods, and selectively removing excess copper using known CMP methods.

During operation of the nanoscale thermoelectric device depicted in FIG. 1 as a refrigerator, bias voltages or bias currents are applied to the second electrode (150) and the first electrode (148) such that the second electrode (150) is at a more positive potential with respect to the first electrode (148), resulting in an operating current flowing from the second electrode (150) through the second n-type active area (116), through the first n-type active area (112), through the central metal terminal (146), through the first p-type active area (110), through the second p-type active area (114) and out the first electrode (148). Proper selection of the bias voltages or bias currents results in heat flow from the central metal terminal (146) to the second electrode (150) and to the first electrode (148), so that the central metal terminal (146) is cooled.

During operation of the nanoscale thermoelectric device depicted in FIG. 1 as a generator, in a first case, a heat source is applied to the central metal terminal (146) so as to raise a temperature of the central metal terminal (146) above temperatures of the second electrode (150) and the first electrode (148). The first electrode (148) develops a positive voltage with respect to the second electrode (150), which may be connected to an electrical load such as a circuit, not shown in FIG. 1 for clarity, in the IC (100).

In a second case of operation of the nanoscale thermoelectric device depicted in FIG. 1 as a generator, heat is applied to the IC substrate (102), so as to raise a temperature of the p-well (106) and n-well (108) above a temperature of the central metal terminal (146). In this case, the second electrode (150) develops a positive voltage with respect to the first electrode (148), which may be connected to an electrical load such as a circuit in the IC (100).

It is advantageous for the first p-type active area (110) and the first n-type active area (112) to be less than 300 nanometers wide because thermal conductivity between the central metal terminal (146) and the p-well (106) and n-well (108) is reduced, thereby increasing an efficiency of the nanoscale thermoelectric device in both the refrigerator mode and the generator mode. Furthermore, there is additional advantage for the second p-type active area (114) to be less than 300 nanometers wide because thermal conductivity between the first electrode (148) and the p-well (106) is reduced, thereby further increasing an efficiency of the nanoscale thermoelectric device in both the refrigerator mode and the generator mode. Similarly, there is additional advantage for the second n-type active area (116) to be less than 300 nanometers wide because thermal conductivity between the second electrode (150) and the n-well (108) is reduced, thereby further increasing an efficiency of the nanoscale thermoelectric device. Vertical thermal conduction in the active areas (110, 112, 114, 116) decreases with the active area widths, further increasing the efficiency of operation.

It is advantageous to increase a thickness of the thermally insulating layer (104) because vertical thermal conduction in the active areas (110, 112, 114, 116) is further reduced, thereby further increasing an efficiency of the nanoscale thermoelectric device. it is also advantageous to form the thermally insulating layer (104) with rough sidewalls to increase phonon scattering and thus desirably reduce vertical thermal conduction in the active areas (110, 112, 114, 116).

In an alternate embodiment, the optional first p-type diffused region (118), second p-type diffused region (120), first n-type diffused region (122) and second n-type diffused region (124) may be formed with different ion implant processes than used to form the NSD and PSD region in NMOS and PMOS transistors, in order to improve an efficiency of the nanoscale thermoelectric device in both the refrigerator mode and the generator mode. For example, the first p-type diffused region (118) and second p-type diffused region (120) may be formed concurrently with p-type lightly doped drain (PLDD) regions in PMOS transistors in the IC (100) and the first n-type diffused region (122) and second n-type diffused region (124) may be formed concurrently with n-type lightly doped drain (NLDD) regions in NMOS transistors in the IC (100).

In yet another embodiment, dislocations may be introduced into the active areas (110, 112, 114, 116) by high energy ion implants of non-doping species, for example implants of silicon or argon, at doses between $5 \cdot 10^{13}$ and $1 \cdot 10^{15}$ atoms/cm$^2$ at energies above 1 MeV, to advantageously reduce vertical thermal conduction in the active areas (110, 112, 114, 116).

In a further embodiment, a thermally insulating layer (152) such as a buried oxide layer may be formed in the substrate (102) under the p-well (106) and n-well (108) which advantageously reduces thermal conduction between the central metal terminal (146) and regions (154) of the substrate (102) below the thermally insulating layer (152).

Figure 2:
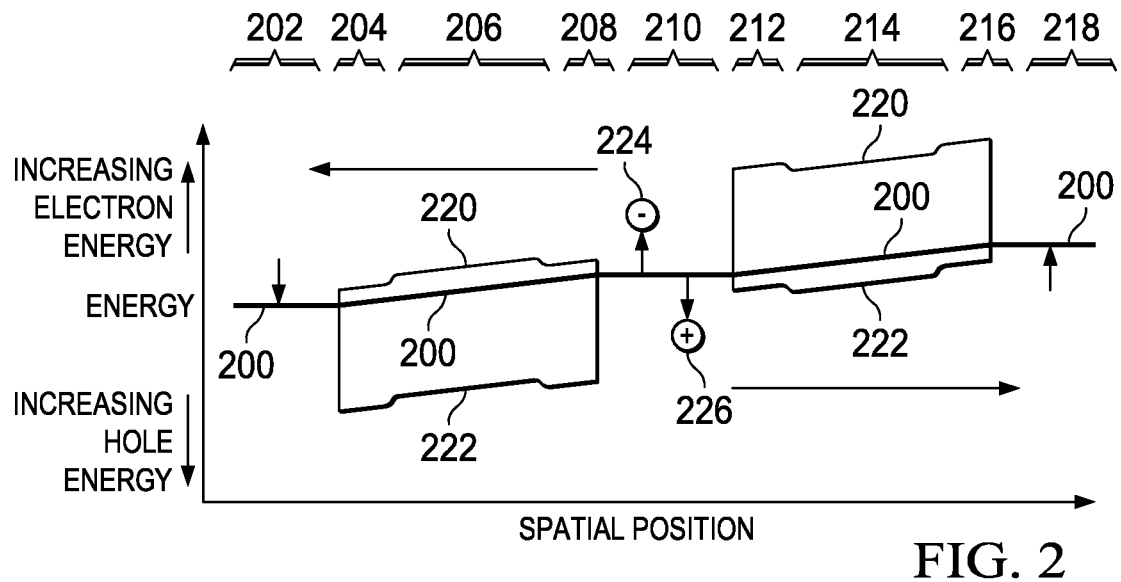
FIG. 2 is an energy band diagram of elements in a nanoscale thermoelectric device, formed according to an embodiment of the instant invention during operation as described in reference to FIG. 1, operated as a refrigerator.

FIG. 2 is an energy band diagram of elements in a nanoscale thermoelectric device, formed according to an embodiment of the instant invention during operation as described in reference to FIG. 1, operated as a refrigerator. A Fermi level (200) is plotted in a second electrode region (202), a second n-type diffused region (204), an n-well region (206), a first n-type diffused region (208), a central metal terminal (210), a first p-type diffused region (212), a p-well region (214), a second p-type diffused region (216) and a first electrode region (218). A conduction band edge (220) and a valence band edge (222) are plotted in the second n-type diffused region (204), n-well region (206) and first n-type diffused region (208) and in the first p-type diffused region (212), p-well region (214) and second p-type diffused region (216). An energy barrier for electrons exists between the Fermi level (200) in the central metal terminal (210) and the conduction band edge (220) in the n-well region (206). Similarly, an energy barrier for holes exists between the Fermi level (200) in the central metal terminal (210) and the valence band edge (222) in the p-well region (214). The conduction band edge (220) and the valence band edge (222) are closer to the Fermi level (200) in the n-type diffused regions (204, 208) and the p-type diffused regions (212, 216), respectively, due to higher dopant densities in the n-type diffused regions (204, 208) and the p-type diffused regions (212, 216) than in the n-well region (206) and p-well region (214).

Still referring to FIG. 2, electrons (224) are thermally generated in the central metal terminal (210) and have some kinetic energy resulting from the thermal generation process. Electrons (224) with sufficient kinetic energy to surmount the energy barrier between the Fermi level (200) in the central metal terminal (210) and the conduction band edge (220) in the n-well region (206) may drift into the n-well region (206) under the influence of the applied biases. Once in the n-well region (206), electrons (224) drift to the second electrode region (202). Removal of electrons (224) with sufficient kinetic energy to surmount the energy barrier between the central metal terminal (210) and the n-well region (206) from the central metal terminal (210) results in a net loss of total energy in the central metal terminal (210) and hence a cooling of the central metal terminal (210). Similarly, holes (226) are thermally generated in the central metal terminal (210) and have some kinetic energy resulting from the thermal generation process. Holes (226) with sufficient kinetic energy to surmount the energy barrier between the Fermi level (200) in the central metal terminal (210) and the valence band edge (222) in the p-well region (214) may drift into the p-well region (214) under the influence of the applied biases. Once in the p-well region (214), holes (226) drift to the first electrode region (218). Removal of holes (226) with sufficient kinetic energy to surmount the energy barrier between the central metal terminal (210) and the p-well region (214) from the central metal terminal (210) results in a net loss of total energy in the central metal terminal (210) and hence a cooling of the central metal terminal (210).

Figure 3:
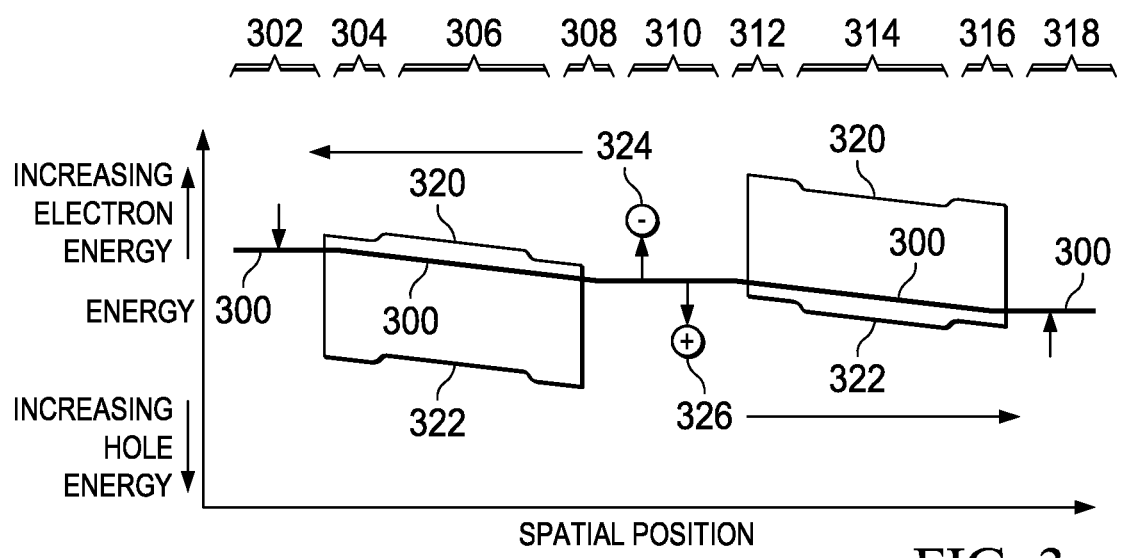
FIG. 3 is an energy band diagram of elements in a nanoscale thermoelectric device, formed according to an embodiment of the instant invention during operation as described in reference to FIG. 1, operated as a generator.

FIG. 3 is an energy band diagram of elements in a nanoscale thermoelectric device, formed according to an embodiment of the instant invention during operation as described in reference to FIG. 1, operated as a generator. A Fermi level (300) is plotted in a second electrode region (302), a second n-type diffused region (304), an n-well region (306), a first n-type diffused region (308), a central metal terminal (310), a first p-type diffused region (312), a p-well region (314), a second p-type diffused region (316) and a first electrode region (318). A conduction band edge (320) and a valence band edge (322) are plotted in the second n-type diffused region (304), n-well region (306) and first n-type diffused region (308) and in the first p-type diffused region (312), p-well region (314) and second p-type diffused region (316). The conduction band edge (320) and the valence band edge (322) are closer to the Fermi level (300) in the n-type diffused regions (304, 208) and the p-type diffused regions (312, 216), respectively, due to higher dopant densities in the n-type diffused regions (304, 208) and the p-type diffused regions (312, 216) than in the n-well region (306) and p-well region (314).

Still referring to FIG. 3, in a first case, a heat source is applied to the central metal terminal (310), causing vertical thermal gradients to be established in the first n-type diffused region (308) and the first p-type diffused region (312). In some cases, lesser thermal gradients are established in the second n-type diffused region (304), the n-well region (306), the p-well region (314) and the second p-type diffused region (316). The vertical thermal gradient in the first n-type diffused region (308) causes electrons (324) to diffuse toward the n-well region (306). Thermal gradients in the n-well region (306) and second n-type diffused region (304) cause electrons (324) to continue to diffuse toward the second electrode region (302). Similarly, the vertical thermal gradient in the first p-type diffused region (312) causes holes (326) to diffuse toward the p-well region (314). Thermal gradients in the p-well region (314) and second p-type diffused region (316) cause holes (326) to continue to diffuse toward the first electrode region (318). The diffusion of electrons toward the second electrode region (302) and the diffusion of holes toward the first electrode region (318) generates a positive voltage on the first electrode region (318) with respect to the second electrode region (302). An electrical current will flow through an electrical load connected to the first electrode region (318) and the second electrode region (302).

The discussion of the operation of the instant invention as a thermoelectric generator in reference to FIG. 3 may be extended to a case in which a heat source is applied to the n-well region (306) and p-well region (314). In such a case, reverse vertical thermal gradients are established in the first n-type diffused region (308) and in the first p-type diffused region (312) of an opposite direction as discussed in reference to the first case. The reverse vertical thermal gradient in the first n-type diffused region (308) causes electrons (324) to diffuse toward the central metal terminal (310). Similarly, the reverse vertical thermal gradient in the first p-type diffused region (312) causes holes (326) to diffuse toward the central metal terminal (310). The diffusion of electrons from the n-well region (306) toward the central metal terminal (310) and the diffusion of holes from the p-well region (314) toward the central metal terminal (310) generates a positive voltage on the second electrode region (302) with respect to the first electrode region (318). An electrical current will flow through an electrical load connected to the second electrode region (302) and the first electrode region (318).

Figure 4A:
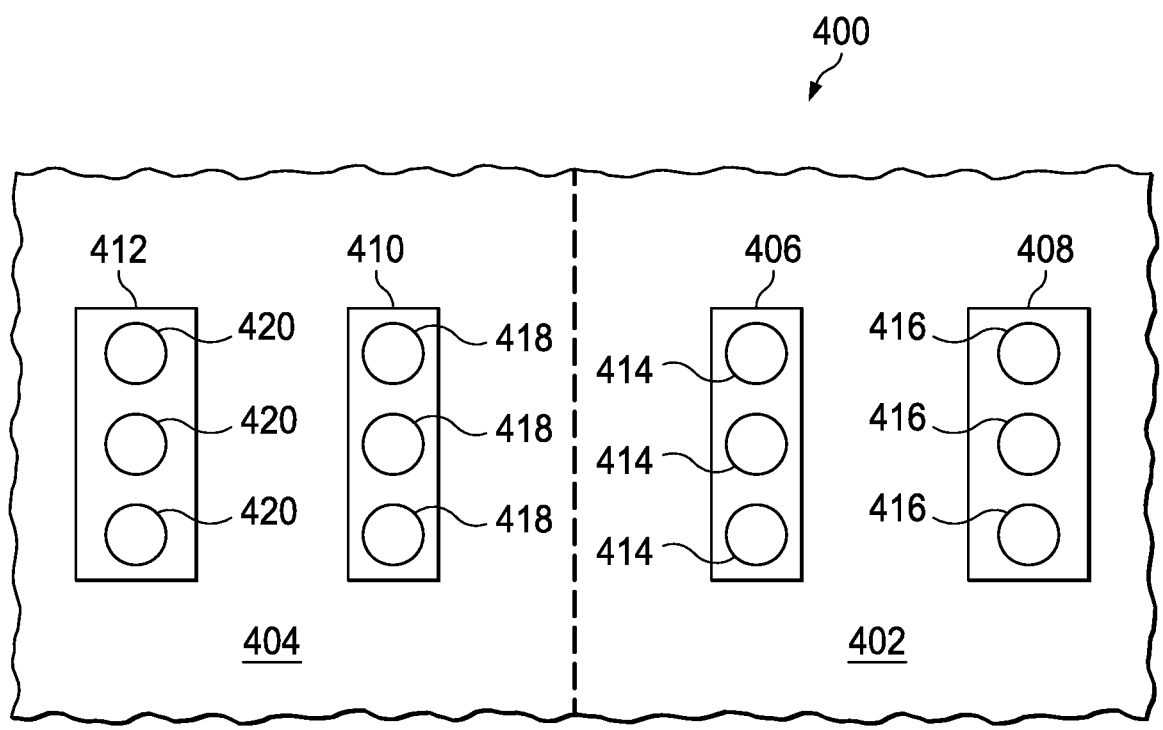
FIG. 4A and FIG. 4B are top views of an IC containing a nanoscale thermoelectric device formed according to an embodiment of the instant invention, in successive stages of fabrication.
Figure 4B:
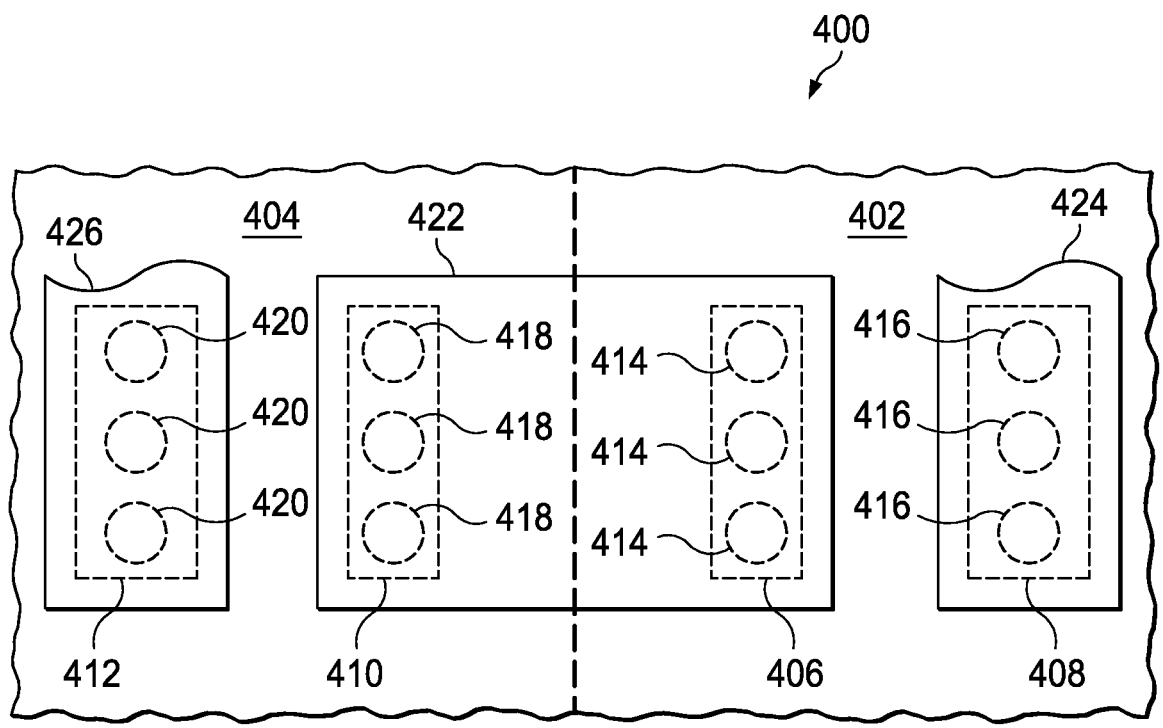

FIG. 4A and FIG. 4B are top views of an IC containing a nanoscale thermoelectric device formed according to an embodiment of the instant invention, in successive stages of fabrication. Referring to FIG. 4A, the IC (400) includes a p-well (402) and an n-well (404). A thermally insulating layer is formed in a top region of the p-well (402) and n-well (404) around a first p-type active area (406), a second p-type active area (408), a first n-type active area (410) and a second n-type active area (412). First p-type active area contacts (414), second p-type active area contacts (416), first n-type active area contacts (418) and second n-type active area contacts (420) are formed on the first p-type active area (406), second p-type active area (408), first n-type active area (410) and second n-type active area (412), respectively.

Referring to FIG. 4B, a central metal terminal (422) electrically connects the first p-type active area contacts (414) with the first n-type active area contacts (418). A first electrode (424) connects the second p-type active area contacts (416) to an external circuit, not shown in FIG. 4B for clarity. Similarly, a second electrode (426) connects the second n-type active area contacts (420) to the external circuit.

Alternate configurations of nanoscale thermoelectric device with one or more first p-type active areas and/or first n-type active areas, possibly oriented at different angles than depicted in FIG. 4A, are within the scope of the instant invention.

Figure 5A:
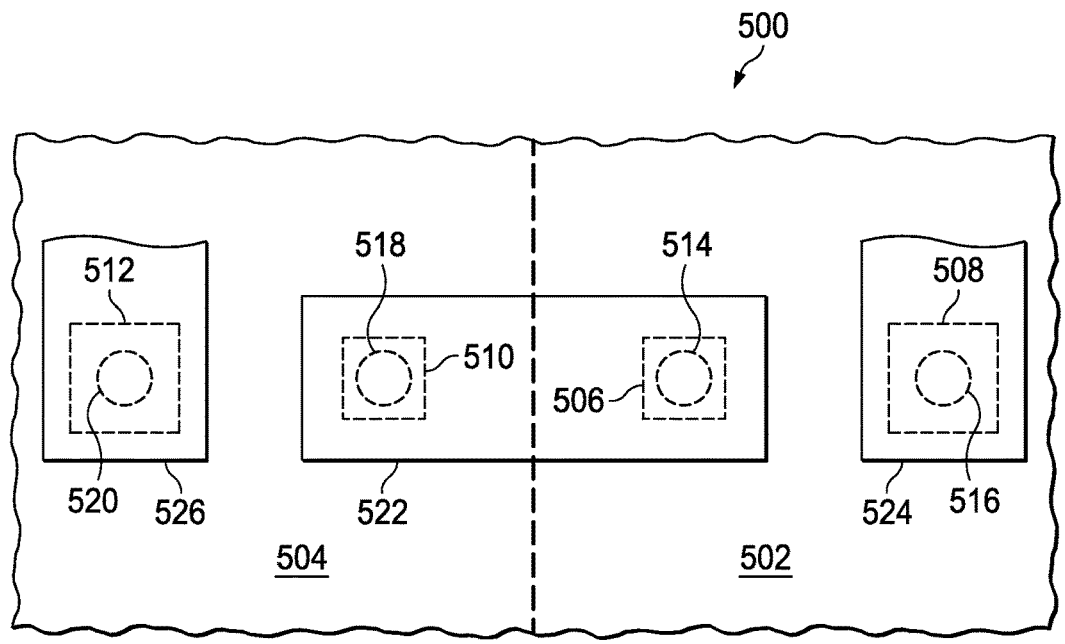
FIG. 5A and FIG. 5B are top views of embodiments of nanoscale thermoelectric devices with actives areas less than 300 nanometers long.
Figure 5B:
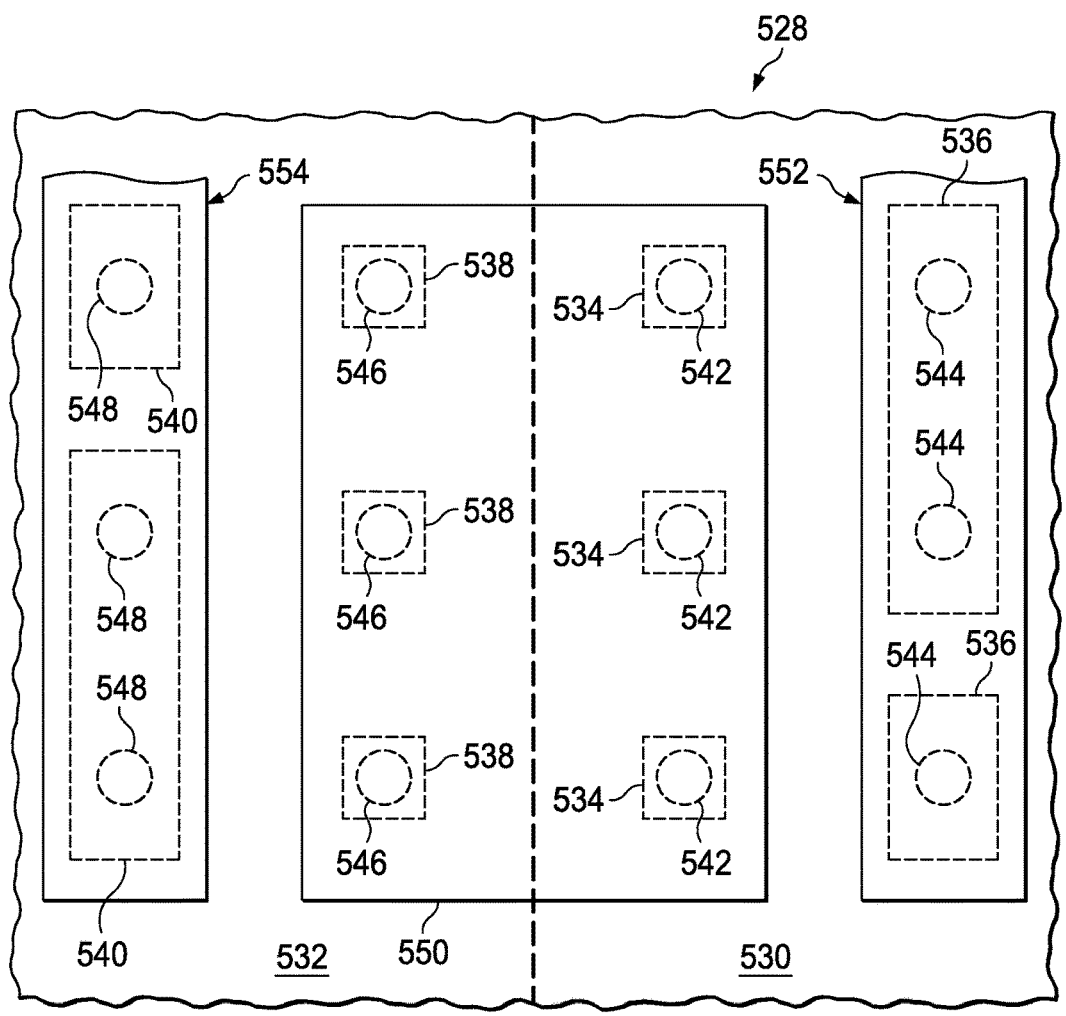

FIG. 5A and FIG. 5B are top views of embodiments of nanoscale thermoelectric devices with actives areas preferably less than 300 nanometers long, and preferably less than 300 nanometers wide. Referring to FIG. 5A, an IC (500) includes a p-well (502) and an n-well (504). A thermally insulating layer is formed in a top region of the p-well (502) around a first p-type active area (506) and a second p-type active area (508), and in a top region of the n-well (504) around a first n-type active area (510) and a second n-type active area (512). The first p-type active area (506) and first n-type active area (510) are preferably less than 300 nanometers in length and width to further reduce vertical thermal conduction in the first p-type active area (506) and first n-type active area (510) to the underlying p-well (502) and the underlying n-well (504), compared to active areas longer than 300 nanometers. Preferably, the second p-type active area (508) and second n-type active area (512) are also less than 300 nanometers in length and width to further reduce vertical thermal conduction. A first p-type active area contact (514), a second p-type active area contact (516), a first n-type active area contact (518) and a second n-type active area contact (520) are formed on the first p-type active area (506), second p-type active area (508), first n-type active area (510) and second n-type active area (512), respectively. A central metal terminal (522) electrically connects the first p-type active area contact (514) with the first n-type active area contact (518). A first electrode (524) connects the second p-type active area (516) to an external circuit, not shown in FIG. 5A for clarity. Similarly, a second electrode (526) connects the second n-type active area contact (520) to the external circuit.

The embodiment depicted in FIG. 5A is advantageous because thermal conductivity between the central metal terminal (522) and the first and second electrodes (524, 426) is reduced compared to embodiments with active areas longer than 300 nanometers, thereby increasing an efficiency of the nanoscale thermoelectric device of the instant embodiment, in both the refrigerator mode and the generator mode.

FIG. 5B depicts an embodiment of the instant invention which obtains the efficiency of the embodiment described in reference to FIG. 5A while providing more cooling power. An IC (528) includes a p-well (530) and an n-well (532). A thermally insulating layer is formed in a top region of the p-well (530) around a set of first p-type active areas (534) and a set of second p-type active areas (536), and in a top region of the n-well (532) around a set of first n-type active areas (538) and a set of second n-type active areas (540). Active areas (534, 536, 538, 540) are preferably less than 300 nanometers in length and width to further reduce vertical thermal conduction compared to active areas longer than 300 nanometers. First p-type active area contacts (542), second p-type active area contacts (544), first n-type active area contacts (546) and second n-type active area contacts (548) are formed on the first p-type active areas (534), second p-type active areas (536), first n-type active areas (538) and second n-type active areas (540), respectively. A central metal terminal (550) electrically connects the first p-type active area contacts (542) with the first n-type active area contacts (546). A first electrode (552) connects the second p-type active area contacts (544) to an external circuit, not shown in FIG. 5B for clarity. Similarly, a second electrode (554) connects the second n-type active area contacts (548) to the external circuit.

The embodiment depicted in FIG. 5B is advantageous because increasing a number of first p-type active areas (534), second p-type active areas (536), first n-type active areas (538) and second n-type active areas (540) increases the cooling power of the nanoscale thermoelectric device in the instant embodiment operated in the refrigerator mode, compared to the embodiment depicted in FIG. 5A. Similarly, the embodiment depicted in FIG. 5B is advantageous because increasing a number of first p-type active areas (534), second p-type active areas (536), first n-type active areas (538) and second n-type active areas (540) increases the electrical power of the nanoscale thermoelectric device in the instant embodiment operated in the generator mode, compared to the embodiment depicted in FIG. 5A.

Figure 6:
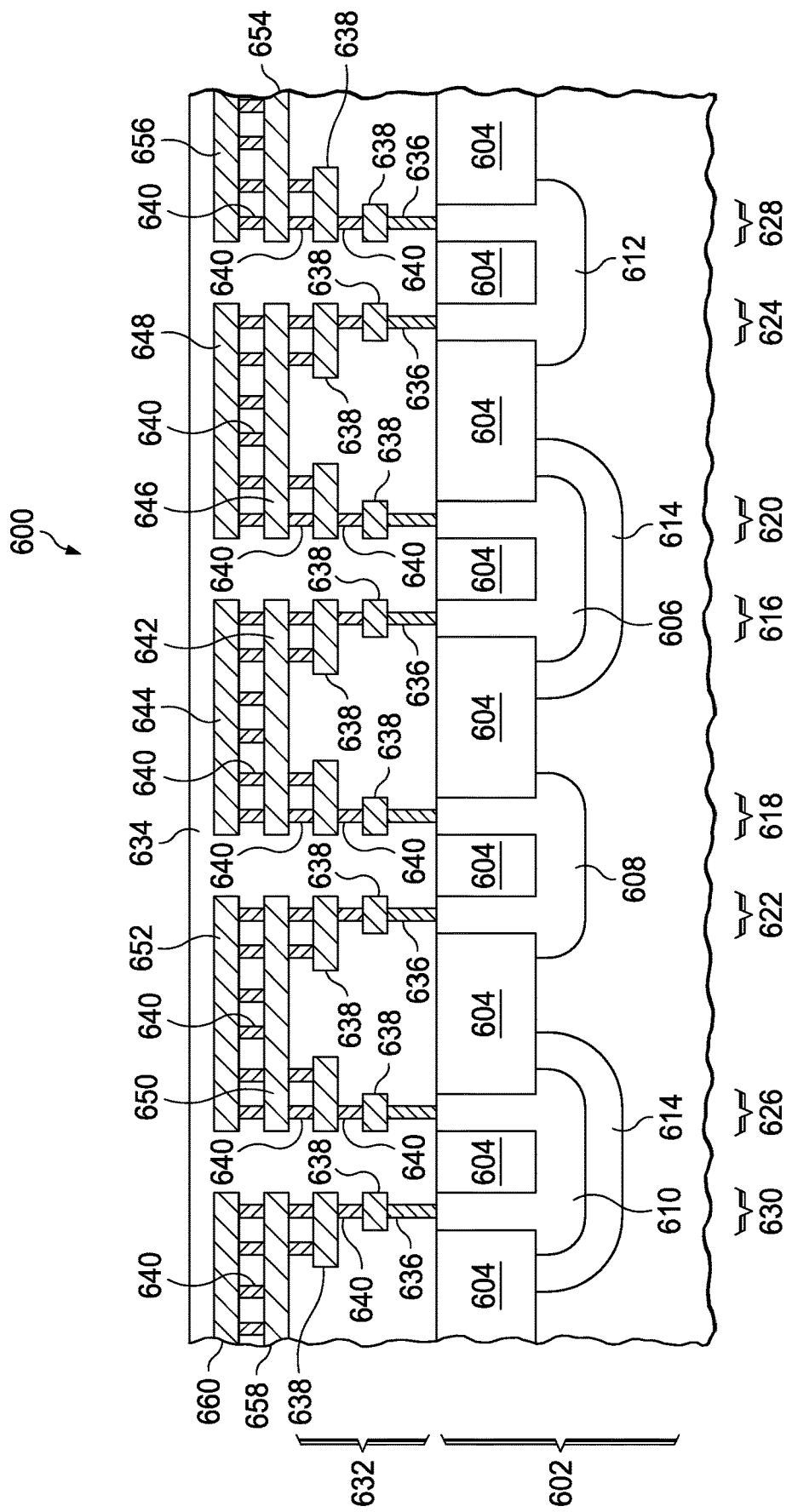
FIG. 6 is a cross-section of an IC which includes a nanoscale thermoelectric device formed according to a further embodiment of the instant invention, in which thermoelectric cells are electrically linked serially.

FIG. 6 is a cross-section of an IC which includes a nanoscale thermoelectric device formed according to a further embodiment of the instant invention, in which thermoelectric cells are electrically linked serially. The IC (600) is formed in a substrate (602) as described in reference to FIG. 1. Elements of thermally insulating material (604) are formed in the substrate (602) at a top surface of the substrate (602) as described in reference to FIG. 1. A first p-well (606), a first n-well (608), a second p-well (610) and a second n-well (612) are formed in the substrate (602) as described in reference to FIG. 1. The first p-well (606) and the second p-well (610) may be electrically isolated from the substrate (602) by deep n-wells (614) which surround the p-wells (606, 610). Openings in the thermally insulating layer (604) define a first p-type active area (616) in the first p-well (606), a first n-type active area (618) in the first n-well (608), a second p-type active area (620) in the first p-well (606), a second n-type active area (622) in the first n-well (608), a third n-type active area (624) in the second n-well (612), a third p-type active area (626) in the second p-well (610), a fourth n-type active area (628) in the second n-well (612) and a fourth p-type active area (630) in the second p-well (610). Optional p-type diffused regions, not shown in FIG. 6 for clarity, may be formed in the p-type active areas (616, 620, 626, 630) as described in reference to FIG. 1. Similarly, optional n-type diffused regions, not shown in FIG. 6 for clarity, may be formed in the n-type active areas (618, 622, 624, 628) as described in reference to FIG. 1. Optional metal silicide layers, not shown in FIG. 6 for clarity, may be formed on top surfaces of the active areas (616, 618, 620, 622, 624, 626, 628, 630) as described in reference to FIG. 1.

Vertical metal connections (632) are formed in a backend dielectric material (634) including a PMD as described in reference to FIG. 1, a first intra-metal dielectric (IMD) layer, and possibly a first inter-level dielectric (ILD) layer, a second IMD layer, a second ILD layer, third IMD layer, and other dielectric layers commonly formed in integrated circuits. The vertical metal connections (632) are formed on the active areas (616, 618, 620, 622, 624, 626, 628, 630), and include contacts (636) as described in reference to FIG. 1, and possibly horizontal metal interconnect elements (638) and vertical metal interconnect elements (640) commonly known as vias. A first electrode (642) is formed to electrically connect to the first p-type active area (616) and to the first n-type active area (618), through the vertical metal connections (632). An optional auxiliary first electrode (644)

may be formed over the first electrode (642) and electrically connected to the first electrode (642) by vias (640) to decrease an electrical resistance between the first p-type active area (616) and the first n-type active area (618). Similarly, a second electrode (646) is formed to electrically connect to the second p-type active area (620) and to the third n-type active area (624), with an optional auxiliary second electrode (648) and vias (640) to decrease an electrical resistance between the second p-type active area (620) and the third n-type active area (624). A third electrode (650) is formed to electrically connect to the second n-type active area (622) and to the third p-type active area (626), with an optional auxiliary third electrode (652) and vias (640) to decrease an electrical resistance between the second n-type active area (622) and the second intermediate terminal p-type active area (626). A fourth electrode (654) is formed to electrically connect the fourth n-type active area (628) to an external circuit, not shown in FIG. 6 for clarity, with an optional auxiliary fourth electrode (656) and vias (640) to reduce an electrical resistance between the fourth n-type active area (628) and the external circuit. A fifth electrode (658) is formed to electrically connect the fourth p-type active area (630) to the external circuit with an optional auxiliary fifth electrode (660) and vias (640) to reduce an electrical resistance between the fourth p-type active area (630) and the external circuit.

Separation of the electrodes (642, 646, 650, 654, 658) from the substrate (602) by including horizontal metal interconnect elements (638) and vias (640) in the vertical metal connections (632) advantageously reduces thermal conduction from the and electrodes (642, 646, 650, 654, 658) to the substrate (602).

Figure 7:
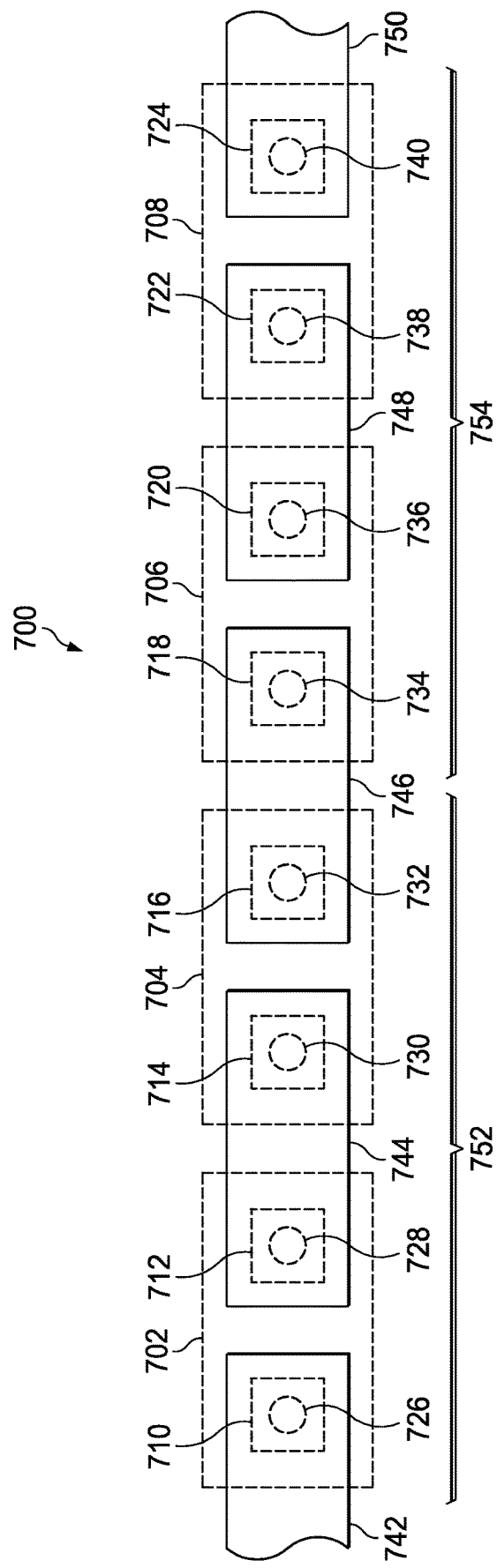
FIG. 7 is a top view of an embodiment of nanoscale thermoelectric devices in which thermoelectric cells are electrically linked serially.

FIG. 7 is a top view of an embodiment of nanoscale thermoelectric devices in which thermoelectric cells are electrically linked serially, as discussed in reference to FIG. 6. A linear configuration (700) of thermoelectric cells includes a first n-well (702), formed as described in reference to FIG. 1. A first p-well (704) is formed as described in reference to FIG. 1 adjacent to the first n-well (702). A second n-well (706) is formed adjacent to the first p-well (704) opposite from the first n-well (702). A second p-well (708) is formed adjacent to the second n-well (706) opposite the first p-well (704). The first p-well (704) and second p-well (708) may be isolated from a substrate by a buried oxide layer (not shown) or a deep n-well (not shown).

A first n-type active area (710) and a second n-type active area (712) are formed in the first n-well (702), as described in reference to FIG. 1. A first p-type active area (714) and a second p-type active area (716) are formed in the first p-well (704), as described in reference to FIG. 1. A third n-type active area (718) and a fourth n-type active area (720) are formed in the second n-well (706), and a third p-type active area (722) and a fourth p-type active area (724) are formed in the second p-well (708).

A first n-type active area vertical metal interconnect (726) and a second n-type active area vertical metal interconnect (728) are formed on the first n-type active area (710) and second n-type active area (712), respectively, as described in reference to FIG. 6. A first p-type active area vertical metal interconnect (730) and a second p-type active area vertical metal interconnect (732) are formed on the first p-type active area (714) and second p-type active area (716), respectively. A third n-type active area vertical metal interconnect (734) and a fourth n-type active area vertical metal interconnect (736) are formed on the third n-type active area (718) and fourth n-type active area (720), respectively. A third p-type active area vertical metal interconnect (738) and a fourth p-type active area vertical metal interconnect (740) are formed on the third p-type active area (722) and fourth p-type active area (724), respectively.

A first electrode (742) is formed on the first n-type active area vertical metal interconnect (726) as described in reference to FIG. 6. A second electrode (744) is formed on the second n-type active area vertical metal interconnect (728) and the first p-type active area vertical metal interconnect (730). A third electrode (746) is formed on the second p-type active area vertical metal interconnect (732) and the third n-type active area vertical metal interconnect (734). A fourth electrode (748) is formed on the fourth n-type active area vertical metal interconnect (736) and the third p-type active area vertical metal interconnect (738). A fifth electrode (750) is formed on the fourth p-type active area vertical metal interconnect (740).

A first thermoelectric cell (752) includes the first electrode (742), the first n-type active area vertical metal interconnect (726), the first n-type active area (710), the first n-well (702), the second n-type active area (712), the second n-type active area vertical metal interconnect (728), the second electrode (744), the first p-type active area vertical metal interconnect (730), the first p-type active area (714), the first p-well (704), the second p-type active area (716), the second p-type active area vertical metal interconnect (732), and the third electrode (746).

A second thermoelectric cell (754) includes the third electrode (746), the third n-type active area vertical metal interconnect (734), the third n-type active area (718), the second n-well (706), the fourth n-type active area (720), the fourth n-type active area vertical metal interconnect (736), the fourth electrode (748), the third p-type active area vertical metal interconnect (738), the third p-type active area (722), the second p-well (708), the fourth p-type active area (724), the fourth p-type active area vertical metal interconnect (740), and the fifth electrode (750). The second thermoelectric cell (754) is electrically connected in series with the first thermoelectric cell (752) through the third electrode (746).

During operation of the nanoscale thermoelectric device depicted in FIG. 7 as a refrigerator, bias voltages or bias currents may be applied to the first electrode (742) and the fifth electrode (750) such that the first electrode (742) is at a more positive potential with respect to the fifth electrode (750), resulting in an operating current flowing serially through the first thermoelectric cell (752) and the second thermoelectric cell (754). Proper selection of the bias voltages or bias currents results in heat flow from the second electrode (744) and the fourth electrode (748) to the first electrode (742), the third electrode (746) and the fifth electrode (750). Formation of the instant embodiment in a serial configuration of thermoelectric cells advantageously provides cooling of multiple locations while desirably using a supply voltage higher than that used for a single thermoelectric cell. Supply voltages appropriate for single thermoelectric cells are frequently less than 50 millivolts, and are commonly unavailable in integrated circuits without incurring undesirable electrical power losses.

During operation of the nanoscale thermoelectric device depicted in FIG. 7 as a generator, heat may be applied to the second electrode (744) and the fourth electrode (748), and extracted from the first electrode (742), the third electrode (746) and the fifth electrode (750), or vice versa, so as to produce an output voltage between the first electrode (742) and the fifth electrode (750). Formation of the instant embodiment in a serial configuration of thermoelectric cells advantageously provides means of extracting thermal power from multiple locations and producing a higher output voltage than that produced from a single thermoelectric cell.

It will be recognized by those familiar with thermoelectric devices that additional thermoelectric cells may be added to a serial configuration of thermoelectric cells to further increase the advantages described above in reference to the embodiment depicted in FIG. 7.

Figure 8:
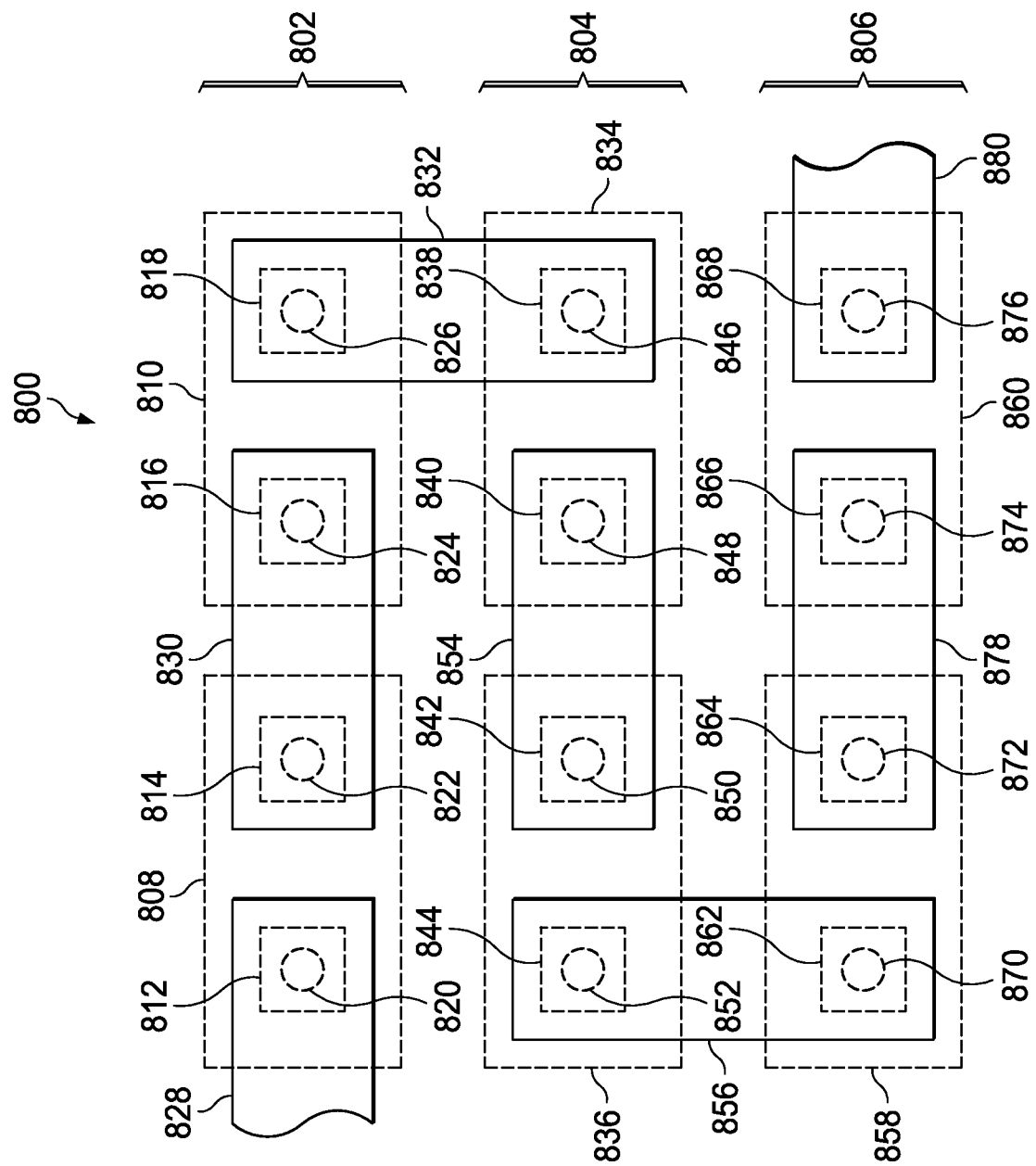
FIG. 8 is a top view of another embodiment of nanoscale thermoelectric devices in which thermoelectric cells are electrically linked serially.

FIG. 8 is a top view of another embodiment of nanoscale thermoelectric devices in which thermoelectric cells are electrically linked serially, as discussed in reference to FIG. 6. A column configuration of horizontal thermoelectric cells (800) includes a first thermoelectric cell (802), a second thermoelectric cell (804) and a third thermoelectric cell (806). The first thermoelectric cell (802) includes a first n-well (808) formed as described in reference to FIG. 1, and a first p-well (810) formed as described in reference to FIG. 1, laterally adjacent to the first n-well (808). The first p-well (810) may be isolated from a substrate by a buried oxide layer (not shown) or a deep n-well (not shown). A first n-type active area (812) and a second n-type active area (814) are formed in the first n-well (808), as described in reference to FIG. 1. A first p-type active area (816) and a second p-type active area (818) are formed in the first p-well (810), as described in reference to FIG. 1. A first n-type active area vertical metal interconnect (820) and a second n-type active area vertical metal interconnect (822) are formed on the first n-type active area (812) and second n-type active area (814), respectively, as described in reference to FIG. 6. A first p-type active area vertical metal interconnect (824) and a second p-type active area vertical metal interconnect (826) are formed on the first p-type active area (816) and second p-type active area (818), respectively. A first electrode (828) is formed on the first n-type active area vertical metal interconnect (820) as described in reference to FIG. 6. A second electrode (830) is formed on the second n-type active area vertical metal interconnect (822) and the first p-type active area vertical metal interconnect (824). A third electrode (832) is formed on the second p-type active area vertical metal interconnect (826).

The second thermoelectric cell (804) includes a second n-well (834) laterally below the first p-well (810) and a second p-well (836) laterally adjacent to the second n-well (834) and laterally below the first n-well (808). The second p-well (836) may be isolated from a substrate by a buried oxide layer (not shown) or a deep n-well (not shown). A third n-type active area (838) and a fourth n-type active area (840) are formed in the second n-well (834). A third p-type active area (842) and a fourth p-type active area (844) are formed in the second p-well (836). A third n-type active area vertical metal interconnect (846) and a fourth n-type active area vertical metal interconnect (848) are formed on the third n-type active area (838) and fourth n-type active area (840), respectively. A third p-type active area vertical metal interconnect (850) and a fourth p-type active area vertical metal interconnect (852) are formed on the third p-type active area (842) and fourth p-type active area (844), respectively. The third electrode (832) is formed on the third n-type active area vertical metal interconnect (846). A fourth electrode (854) is formed on the fourth n-type active area vertical metal interconnect (848) and the third p-type active area vertical metal interconnect (850). A fifth electrode (856) is formed on the fourth p-type active area vertical metal interconnect (852).

The third thermoelectric cell (806) includes a third n-well (858) laterally below the second p-well (836) and a third p-well (860) laterally adjacent to the third n-well (858) and laterally below the second n-well (834). The third p-well (860) may be isolated from a substrate by a buried oxide layer (not shown) or a deep n-well (not shown). A fifth n-type active area (862) and a sixth n-type active area (864) are formed in the third n-well (858). A fifth p-type active area (866) and a sixth p-type active area (868) are formed in the third p-well (860). A fifth n-type active area vertical metal interconnect (870) and a sixth n-type active area vertical metal interconnect (872) are formed on the fifth n-type active area (862) and sixth n-type active area (864), respectively. A fifth p-type active area vertical metal interconnect (874) and a sixth p-type active area vertical metal interconnect (876) are formed on the fifth p-type active area (866) and sixth p-type active area (868), respectively. The fifth electrode (856) is formed on the fifth n-type active area vertical metal interconnect (870). A sixth electrode (878) is formed on the sixth n-type active area vertical metal interconnect (872) and the fifth p-type active area vertical metal interconnect (874). A seventh electrode (880) is formed on the sixth p-type active area vertical metal interconnect (876).

The second thermoelectric cell (804) is electrically connected in series with the first thermoelectric cell (802) through the third electrode (832). The third thermoelectric cell (806) is electrically connected in series with the second thermoelectric cell (804) through the fifth electrode (856).

During operation of the nanoscale thermoelectric device depicted in FIG. 8 as a refrigerator, bias voltages or bias currents may be applied to the first electrode (828) and the seventh electrode (880) such that the first electrode (828) is at a more positive potential with respect to the seventh electrode (880), resulting in an operating current flowing serially through the first thermoelectric cell (802), the second thermoelectric cell (804) and the third thermoelectric cell (806). Proper selection of the bias voltages or bias currents results in heat flow from the second electrode (830) to the first electrode (828), the third electrode (832), heat flow from the fourth electrode (854) to the third electrode (832) and the fifth electrode (856), and heat flow from the sixth electrode (878) to the fifth electrode (856) and the seventh electrode (880). Formation of the instant embodiment in a column configuration of horizontal thermoelectric cells advantageously provides cooling of an extended area while desirably using a supply voltage higher than that used for a single thermoelectric cell.

During operation of the nanoscale thermoelectric device depicted in FIG. 8 as a generator, heat may be applied to the second electrode (830), the fourth electrode (854) and the sixth electrode (878), and extracted from the first electrode (828), the third electrode (832), the fifth electrode (856), and the seventh electrode (880), or vice versa, so as to produce an output voltage between the first electrode (828) and the seventh electrode (880). Formation of the instant embodiment in a column configuration of horizontal thermoelectric cells advantageously provides means of extracting thermal power from an extended area and producing a higher output voltage than that produced from a single thermoelectric cell.

It will be recognized by those familiar with thermoelectric devices that additional thermoelectric cells may be added to a column configuration of horizontal thermoelectric cells to further increase the advantages described above in reference to the embodiment depicted in FIG. 8.

What is claimed is:

1. A process of forming a thermally responsive device in an integrated circuit, comprising the steps of:
   forming a thermoelectric device in a substrate comprising silicon, including:
   forming a p-well;
   forming an n-well proximate to said p-well;

forming a first shallow trench isolation (STI) structure between and touching said p-well and said n-well, second and third STI structures in said p-well, and fourth and fifth STI structures in said n-well, a first p-type active area defined by and touching said first and second STI structures, a second p-type active area defined by and touching said second and third STI structures, a first n-type active area defined by and touching said first and fourth STI structures, and a second n-type active area defined by and touching said fourth and fifth STI structures;

forming a first vertical metal connection on said first p-type active area;

forming a second vertical metal connection on said first n-type active area forming a central metal terminal on said first vertical metal connection and on said second vertical metal connection, such that said central metal terminal is electrically connected to said first p-type active area and to said first n-type active area;

forming a third vertical metal connection on said second p-type active area;

forming a fourth vertical metal connection on said second n-type active area forming a first electrode on said third vertical metal connection, such that said first electrode is electrically connected to said second p-type active area; and forming a second electrode on said fourth vertical metal connection, such that said second electrode is electrically connected to said second n-type active area.

2. The process of claim 1, further including the steps of:

forming a third p-type active area in said p-well;

forming a fifth vertical electrical connection on said third p-type active area, wherein said fifth vertical electrical connection contacts said central metal terminal, such that said third p-type active area is electrically connected to said central metal terminal;

forming a third n-type active area in said n-well;

forming a sixth vertical electrical connection on said third n-type active area, wherein said sixth vertical electrical connection contacts said central metal terminal, such that said third n-type active area is electrically connected to said central metal terminal;

forming a fourth p-type active area in said p-well;

forming a seventh vertical electrical connection on said fourth p-type active area, wherein said seventh vertical electrical connection contacts said first electrode, such that said fourth p-type active area is electrically connected to said first electrode;

forming a fourth n-type active area in said n-well; and forming an eighth vertical electrical connection on said fourth n-type active area, wherein said eighth vertical electrical connection contacts said second electrode, such that said fourth n-type active area is electrically connected to said second electrode.

3. The process of claim 1, further including:

forming a second p-well, proximate to a first n-well;

forming a second n-well, proximate to a first p-well;

forming a third p-type active area in said second p-well;

forming a fifth vertical electrical connection on said third p-type active area, wherein said fifth vertical electrical connection contacts said second electrode, such that said third p-type active area is electrically connected to said second electrode;

forming a third n-type active area in said second n-well;

forming a sixth vertical electrical connection on said third n-type active area, wherein said sixth vertical electrical connection contacts said first electrode, such that said third n-type active area is electrically connected to said first electrode;

forming a fourth n-type active area, formed in said second n-well;

forming a seventh vertical electrical connection on said fourth n-type active area;

forming a third electrode on said seventh vertical electrical connection, such that said third electrode is electrically connected to said fourth n-type active area;

forming a fourth p-type active area, formed in said second p-well;

forming an eighth vertical electrical connection on said fourth p-type active area; and forming a fourth electrode on said eighth vertical electrical connection, such that said fourth electrode is electrically connected to said fourth p-type active area.

4. The process of claim 1, in which:

said first p-type active area comprises silicon-germanium (Si—Ge); and said second p-type active area comprises Si—Ge.

5. The process of claim 1, further including:

forming a first p-type diffused region in a top region of said first p-type active area such that an average p-type dopant density in said first p-type diffused region is more than five times higher than an average p-type dopant density in said p-well;

forming a second p-type diffused region in a top region of said second p-type active area such that an average p-type dopant density in said second p-type diffused region is more than five times higher than said average p-type dopant density in said p-well;

forming a first n-type diffused region in a top region of said first n-type active area such that an average n-type dopant density in said first n-type diffused region is more than five times higher than an average n-type dopant density in said n-well; and forming a second n-type diffused region in a top region of said second n-type active area such that an average n-type dopant density in said second n-type diffused region is more than five times higher than said average n-type dopant density in said n-well.

6. The process of claim 1, further including forming first and second p-type diffused regions in the p-well, and first and second n-type diffused regions in said n-well.

7. The process of claim 1, wherein said first and second p-type active areas, and said first and second n-type active areas are less than 300 nanometers wide.

8. The process of claim 1, wherein the first, second, third, fourth and fifth STI structures are spaced apart such that a space between each STI structure and a nearest-neighbor STI structure is less than 300 nm.

* * * * *